(12) United States Patent
Shino et al.

(10) Patent No.: US 8,154,540 B2
(45) Date of Patent: Apr. 10, 2012

(54) DRIVE CIRCUIT OF DISPLAY PANEL AND DISPLAY APPARATUS

(75) Inventors: Kenji Shino, Yokohama (JP); Yasukazu Noine, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 613 days.

(21) Appl. No.: 12/362,882

(22) Filed: Jan. 30, 2009

(65) Prior Publication Data

US 2009/0195522 A1 Aug. 6, 2009

(30) Foreign Application Priority Data

Feb. 6, 2008 (JP) ................................. 2008-026346
Jan. 6, 2009 (JP) ................................. 2009-000850

(51) Int. Cl.
*G09G 5/00* (2006.01)
(52) U.S. Cl. ...................................................... 345/204
(58) Field of Classification Search ................... 345/204
See application file for complete search history.

(56) References Cited

U.S. PATENT DOCUMENTS

| 5,877,647 | A * | 3/1999 | Vajapey et al. | 327/391 |
| 5,880,624 | A * | 3/1999 | Koyanagi et al. | 327/541 |
| 6,628,261 | B1 * | 9/2003 | Sato et al. | 345/99 |
| 7,907,136 | B2 * | 3/2011 | Kobayashi | 345/208 |
| 2003/0025687 | A1 | 2/2003 | Shino et al. | 345/204 |
| 2003/0038792 | A1 | 2/2003 | Murayama et al. | 345/204 |
| 2004/0001039 | A1 | 1/2004 | Shino et al. | |
| 2004/0217950 | A1 * | 11/2004 | Shino et al. | 345/204 |
| 2006/0007211 | A1 | 1/2006 | Murayama et al. | 345/204 |
| 2006/0158393 | A1 | 7/2006 | Fukumoto et al. | |
| 2006/0250345 | A1 * | 11/2006 | Shino et al. | 345/100 |
| 2006/0256101 | A1 | 11/2006 | Shino et al. | 345/204 |
| 2008/0246750 | A1 | 10/2008 | Shino et al. | 345/211 |
| 2009/0195528 | A1 * | 8/2009 | Shino et al. | 345/212 |

FOREIGN PATENT DOCUMENTS

| EP | 1 282 100 A2 | 5/2003 |
| EP | 1 742 361 A1 | 10/2007 |
| JP | 2003-131611 | 5/2003 |
| JP | 2004-004429 | 1/2004 |

OTHER PUBLICATIONS

European Search Report dated Mar. 11, 2010, in related corresponding European Patent Appln. No. 09152154.2.

* cited by examiner

*Primary Examiner* — Richard Hjerpe
*Assistant Examiner* — Dorothy Harris
(74) *Attorney, Agent, or Firm* — Fitzpatrick, Cella, Harper & Scinto

(57) ABSTRACT

A drive circuit of a display panel having wirings and display devices connected to the wirings includes a first switch that transits potential of the wirings toward a first potential, a feedback amplifier that maintains the potentials of the wirings at the first potential, and a second switch that selects whether or not to supply an output from the feedback amplifier to the wirings. In addition, a self switch controls the second switch by comparing the potential of the wirings with a reference potential that is higher by a predetermined value than the first potential. The first switch and the second switch are connected to the wirings in parallel, and a drive performance of the first switch is lower than that of the second switch.

3 Claims, 9 Drawing Sheets

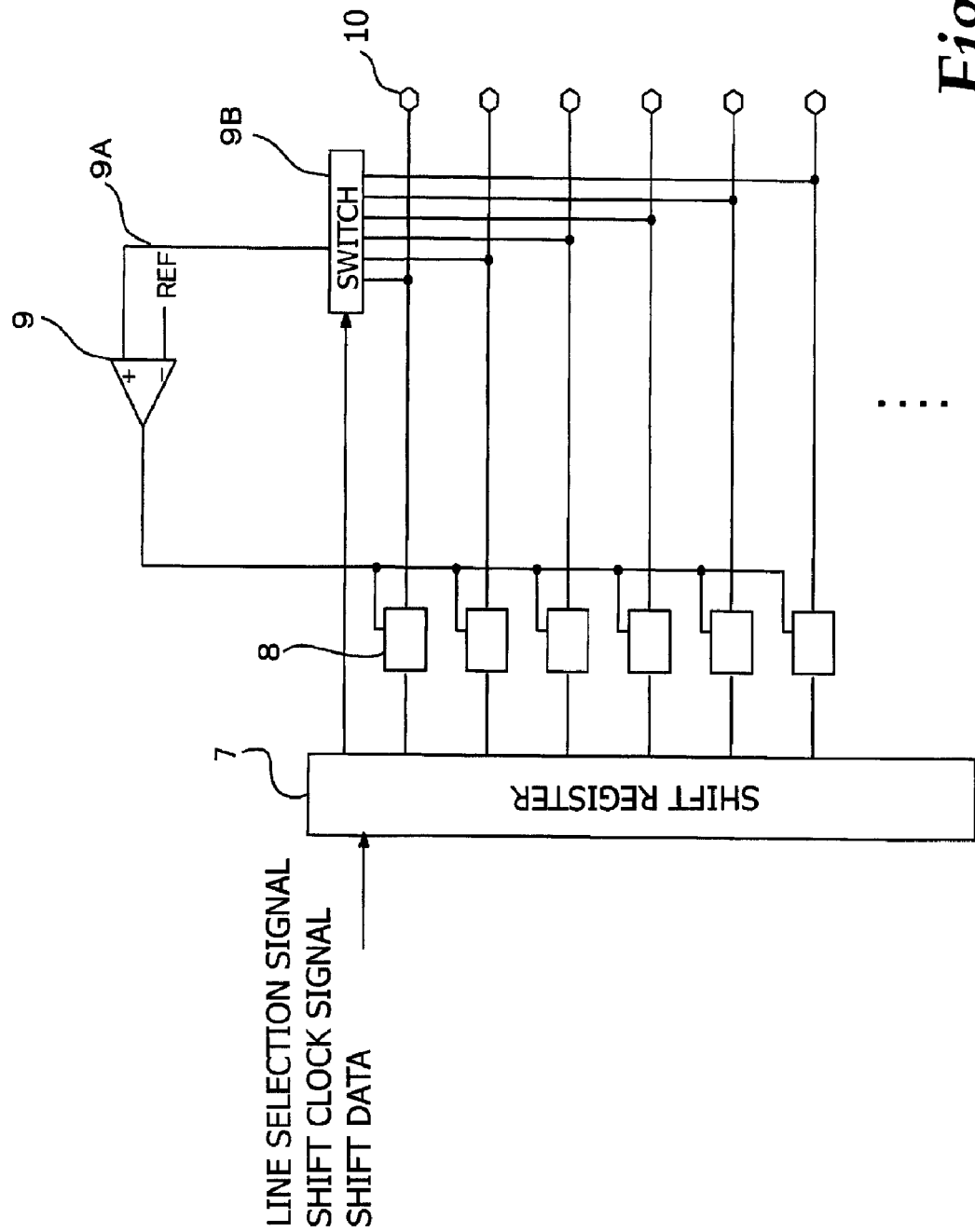

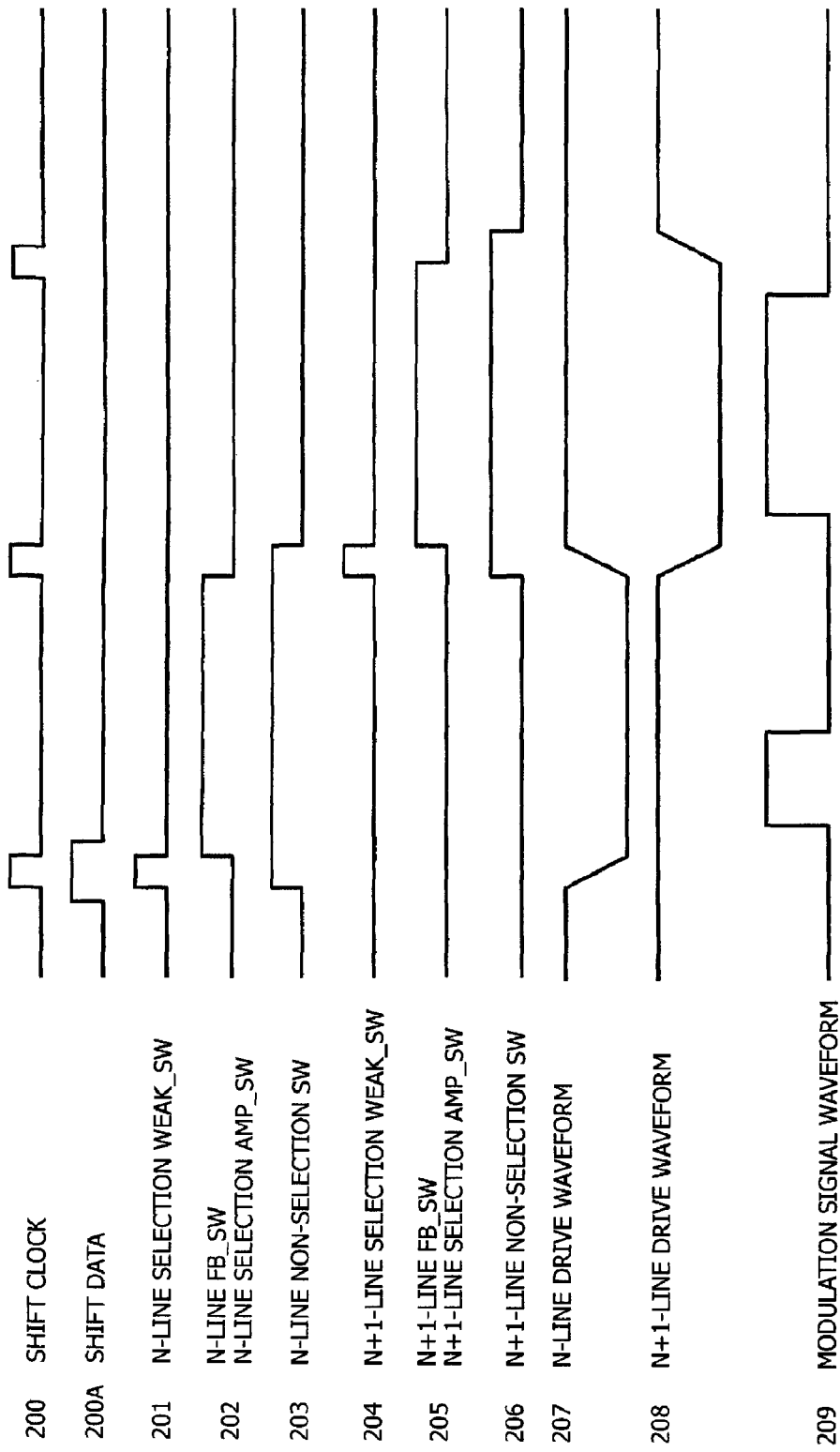

DRIVE CIRCUIT OF DISPLAY PANEL AND DISPLAY APPARATUS

BACKGROUND OF THE INVENTION

1. Field of the Invention

The present invention relates to a drive circuit of a display panel and a display apparatus.

2. Description of the Related Art

Flat display apparatuses such as electron beam display apparatuses, plasma display apparatuses and organic EL display apparatuses are known. Such a kind of display apparatuses has a display panel (matrix panel) where a lot of display devices are arranged in a matrix pattern, and a drive circuit which drives the display devices.

Japanese Patent Application Laid-Open No. 2003-131611 discloses a drive circuit of a display apparatus which controls feedback of a voltage using an operational amplifier. In this circuit configuration, however, in order to repress overshoot and undershoot at the time of potential transition, a phase characteristic of an amplifier should be secured over a wide output voltage range including selection potential through non-selection potential.

Japanese Patent Application Laid-Open No. 2004-4429 discloses a drive circuit which uses a combination of a plurality of MOSFETs having different ON-state resistances. In this circuit configuration, however, in order to avoid voltage drop caused by the ON-state resistances of the MOSFETs, the size of the MOSFETs should be increased.

SUMMARY OF THE INVENTION

It is an object of the present invention to provide a drive circuit of a display panel and a display apparatus which can output a stable driving waveform in a simple and inexpensive circuit configuration.

A first aspect of the invention is a drive circuit which drives a display panel having wirings and display devices connected to the wirings, including: a first switch that transits potentials of the wirings toward a first potential; a feedback amplifier that maintains the potentials of the wirings at the first potential; and a second switch that selects whether or not to supply an output from the feedback amplifier to the wirings, wherein the first switch and the second switch are connected to the wirings in parallel, and a drive performance of the first switch is lower than that of the feedback amplifier.

A second aspect of the invention is a display apparatus including: the above drive circuit; and a display panel that is driven by the drive circuit.

According to the present invention, the drive circuit of the display panel which can output stable driving waveforms in a simple and an inexpensive circuit configuration, and the display apparatus can be provided.

BRIEF DESCRIPTION OF THE DRAWINGS

FIG. 3 is a block diagram illustrating the scan driving unit;

FIG. 4 is a diagram illustrating operations and output waveforms of the scan driving unit according to the first embodiment;

DESCRIPTION OF THE EMBODIMENTS

Embodiments of the present invention are described below with reference to the drawings. In all the drawings of the embodiments, like or corresponding portions are denoted by like symbols.

The present invention can be applied preferably to an image display apparatus which has a display panel (matrix panel) where a lot of display devices are arranged in a matrix pattern. Examples of such a kind of image display apparatuses are electron beam display apparatuses, plasma display apparatuses and organic EL display apparatuses. In an electron beam display apparatus, a cold cathode device such as an FE type electron-emitting device, an MIM type electron-emitting device or a surface conduction electron-emitting device is preferably used.

First Embodiment

Constitution of Image Display Apparatus

Figure 2A:
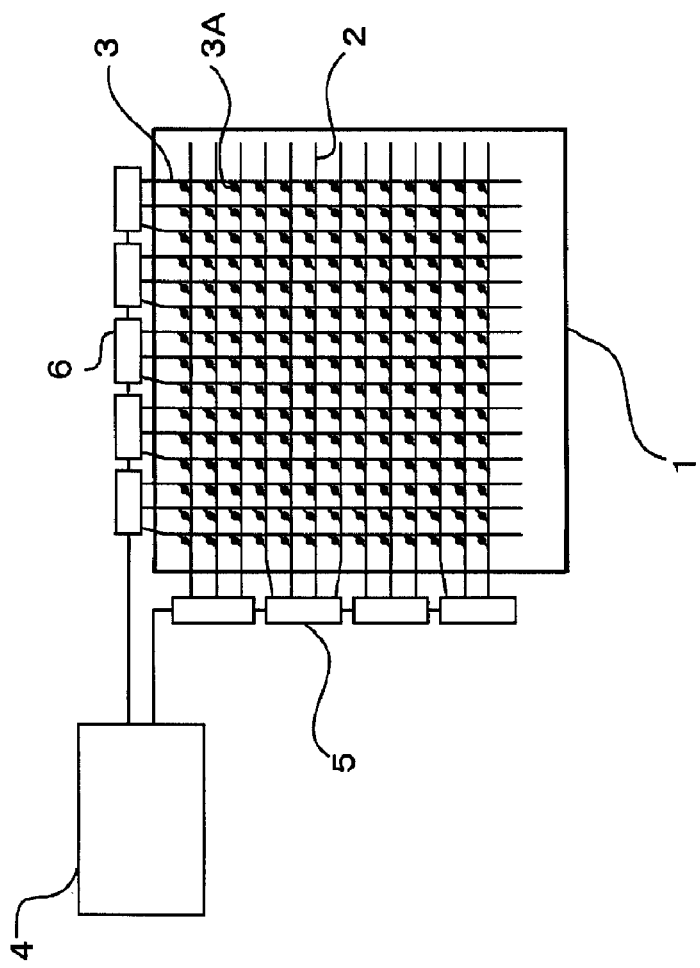
FIG. 2A is a plan view illustrating an image display apparatus.
Figure 2B:
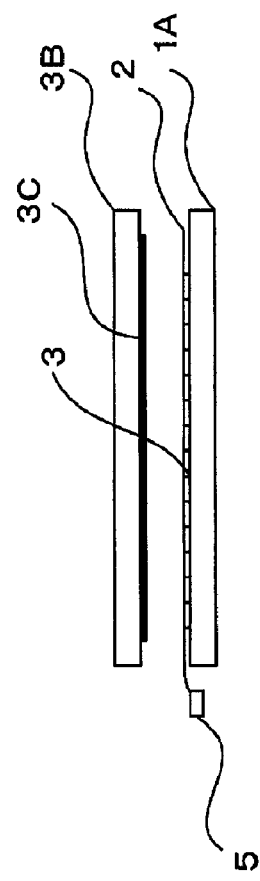
FIG. 2B is a cross-sectional view illustrating the image display apparatus.

FIGS. 2A and 2B are diagrams illustrating a constitution of the image display apparatus, FIG. 2A is a plan view, and FIG. 2B is a cross-sectional view. The image display apparatus includes a matrix panel (display panel) 1, a control unit 4, a scan driving unit 5 and a modulation driving unit 6. The scan driving unit 5 and the modulation driving unit 6 are composed of ICs (integrated circuits) respectively. The matrix panel 1 has a rear plate 1A on which a plurality of electron-emitting devices 3A (also as electron sources) is arranged, and a face plate 3B on which a phosphor 3C is arranged. Surface conduction electron-emitting devices are used as the electron-emitting devices 3A. The electron-emitting devices on the rear plate 1A are matrix-driven through scanning wirings 2 and modulation wirings 3. The scanning wirings 2 are connected to output terminals of the scan driving unit 5 via a flexible printed wiring board (FPC) or the like. The modulation wirings 3 are connected to output terminals of the modulation driving unit 6 via FPC or the like.

The control unit 4 controls the scan driving unit 5 and the modulation driving unit 6, and a driving voltage of several dozen volts is applied between the scanning wirings 2 and the modulation wirings 3. As a result, electrons are emitted from the electron-emitting devices 3A. A high voltage of several kV to several dozen kV is applied to the face plate 3B. The electrons emitted from the electron-emitting devices 3A are attracted to the face plate 3B, and collide against the phosphor 3C. As a result, light emission can be obtained. Brightness at this time is determined by an amount of the electrons colliding against the phosphor 3C in a predetermined period. Therefore, the brightness can be controlled by a value of the driving voltage or an applying period or both of them. As a result, gradation display is enabled.

In the first embodiment, the control unit 4 controls voltages of a scanning signal to be applied to the scanning wirings 2 and a modulation signal to be applied to the modulation wirings 3, so that various videos are displayed. The brightness obtained by light emission from the phosphor 3C, as mentioned previously, is determined by the driving voltage of the electron-emitting devices (a potential difference between the scanning signal and the modulation signal). Therefore, in order to obtain accurate luminance characteristics, stabilization of the driving voltage of the electron-emitting devices 3A, namely, prevention of waveform disturbance of the driving voltage (overshoot, undershoot, ringing, and the like) becomes important.

(Driving Unit)

The scan driving unit 5 is a drive circuit which selects one or a plurality of scanning wirings 2. The scan driving unit 5 applies a selection potential to the scanning wirings 2 to be selected, and applies a non-selection potential to the other scanning wirings 2. The scanning wirings 2 to be selected are sequentially switched, so that scanning in a vertical direction is realized. The scan driving unit 5 is composed of integrated circuits. If one integrated circuit scans all the scanning wirings, a difference in path lengths from the integrated circuit to the respective scanning wirings becomes large. In order to solve this problem, a plurality (four) of integrated circuits are used so as to compose the scan driving unit 5 in this embodiment.

The modulation driving unit 6 is a drive circuit which applies a modulation signal modulated based on an input image signal to the modulation wirings 3. The modulation signal is generated from an output of single or a plurality of constant voltage power sources. The modulation driving unit 6 is also composed of several integrated circuits (five integrated circuits in this embodiment)

(Modulation Signal)

The modulation signal is described with reference to FIG. 4. Reference numeral 207 denotes a waveform of the scanning signal to be applied to the scanning wiring on line N, and reference numeral 208 denotes a waveform of the scanning signal to be applied to the scanning wiring on line N+1. A selection potential of minus dozen V to several dozen V is applied to lines to be selected for a predetermined period (for example, one horizontal scanning period). Reference numeral 209 denotes a waveform of the modulation signal to be applied to a certain modulation wiring. The modulation driving unit 6 outputs a modulation signal during a period (LOW period) at which the selection potential is applied to the scanning wirings. In this embodiment, the modulation signal having a pulse width modulation waveform of plus several dozen V is used. Normally, in the image display apparatus using the surface conduction electron-emitting devices, the wider the pulse width is, the larger the integrated value of luminance becomes, and the brighter the device becomes. In the example of FIG. 4, therefore, the luminance of the display device on line N+1 is higher than that of the display device on line N.

(Scan Driving Unit)

The constitution and the operation of the scan driving unit 5 are described concretely below. FIG. 3 is a block diagram of the scan driving unit 5. As shown in FIG. 3, the scan driving unit 5 has a shift register unit 7, buffered switches 8, a feedback switch 9B and a feedback amplifier 9.

The shift register unit 7 is a logic circuit which determines a line to be selected, and generates/outputs a control signal. The shift register unit 7 includes a shift register composed of D flip-flops, not shown, and a logic device which performs logical operations on an output from the shift register, a shift clock and an output of shift data.

The buffered switches 8 are circuits which convert shift data (control signal) output from the shift register unit 7 into a voltage/current level necessary for driving the scanning wirings and output the converted data.

The feedback switch 9B is a circuit that selects which IC driving output (output pad) 10 to be connected to the input 9A of the amplifier 9 based on the signal from the shift register unit 7. A potential of a selected line (scanning wiring) is fed back to the amplifier 9. A selection potential V1 is connected as a reference potential REF to the other input of the amplifier 9. The amplifier 9 compares the potential of the selected scanning wiring with the reference potential REF so as to control the buffered switch 8 using a signal according to the difference therebetween. As a result, the potential of the selected scanning wiring is maintained at the reference potential REF.

Operations of the buffered switches and the amplifier are described concretely below. For simple description, only a constitution relating to an output for one channel is described.

Figure 7:
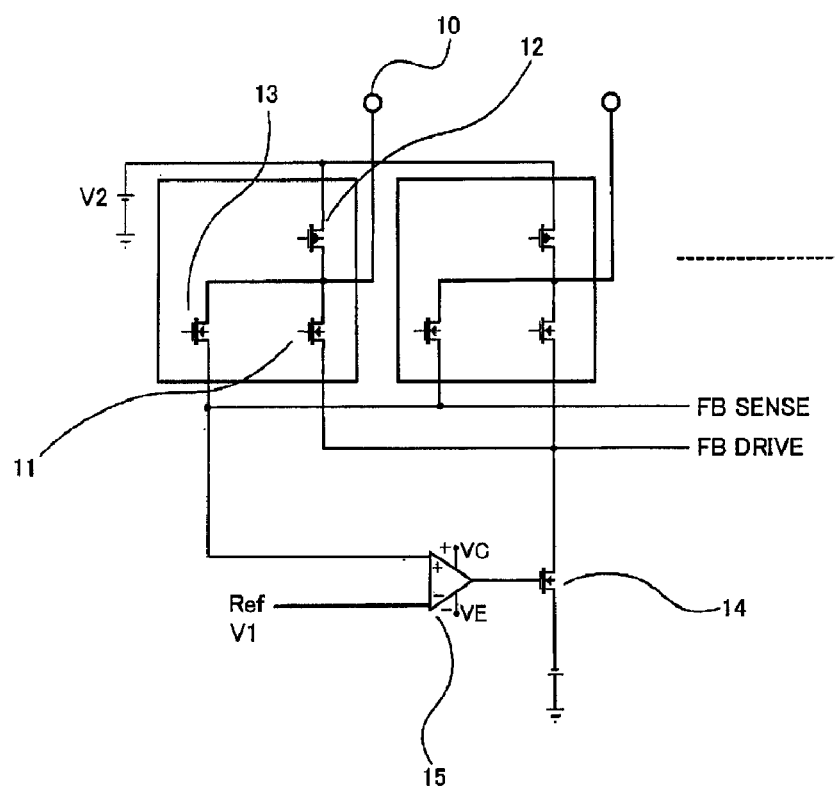
FIG. 7 is a diagram illustrating a circuit configuration of a conventional scan driving unit.
Figure 8:
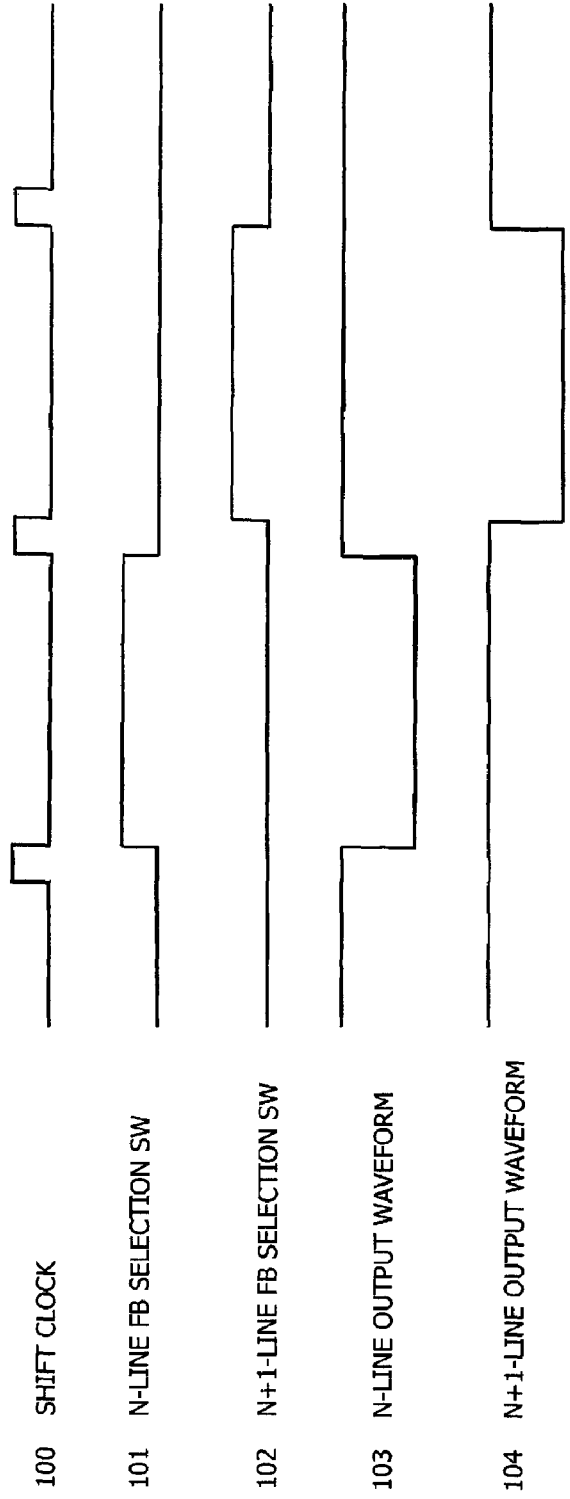
FIG. 8 is a diagram explaining operations of the circuit in FIG. 7.

A conventional constitution is described with reference to FIGS. 7 and 8. An N-ch MOSFET for feedback 13 in FIG. 7 corresponds to the feedback switch 9B in FIG. 3. A strong drive performance P-ch MOSFET (P-ch MOSFET of a high drive performance) 12 controls the IC driving output 10 to the non-selection potential V2 so as to regulate the potential of the scanning wiring to the non-selection potential V2. A strong drive performance N-ch MOSFET (N-ch MOSFET of a high drive performance) 11 regulates the potential of the scanning wiring to the selection potential V1. A source terminal of the strong drive performance N-ch MOSFET 11 for each scanning wiring is connected to a common line, and the common line is connected to an output terminal of an OPAMP (operational amplifier) 15 via an AMP_N-ch MOSFET 14. An N-line FB selection SW signal 101 shown in FIG. 8 is input into the N-ch MOSFET 13 for feedback during a selection period. The N-ch MOSFET 13 for feedback is then turned on, and the potential of the selected IC driving output 10 is fed back to the OPAMP 15. The potential of the IC driving output 10 is lower than the selection potential V1 due to voltage drop caused by an electric current flowing in the scanning wirings and ON-state resistance of the strong drive performance N-ch MOSFET 11. Therefore, the OPAMP 15 compares the potential of the IC driving output 10 with the reference potential (selection potential V1), and controls the AMP_N-ch MOSFET 14 so that the IC driving output 10 becomes the reference potential. As a result, an N-line output waveform 103 as shown in FIG. 8 can be obtained.

In the conventional constitution, the operating voltage of the amplifying circuit should cope with all potentials between the non-selection potential V2 to the selection potential V1. In order to suppress the waveform disturbance, an amplifier band and a slew rate should be controlled within the entire scanning voltage range. Therefore, the OPAMP 15 and the AMP_N-ch MOSFET 14 require high speed within the entire voltage range, and thus this contributes to increasing cost.

Figure 1:
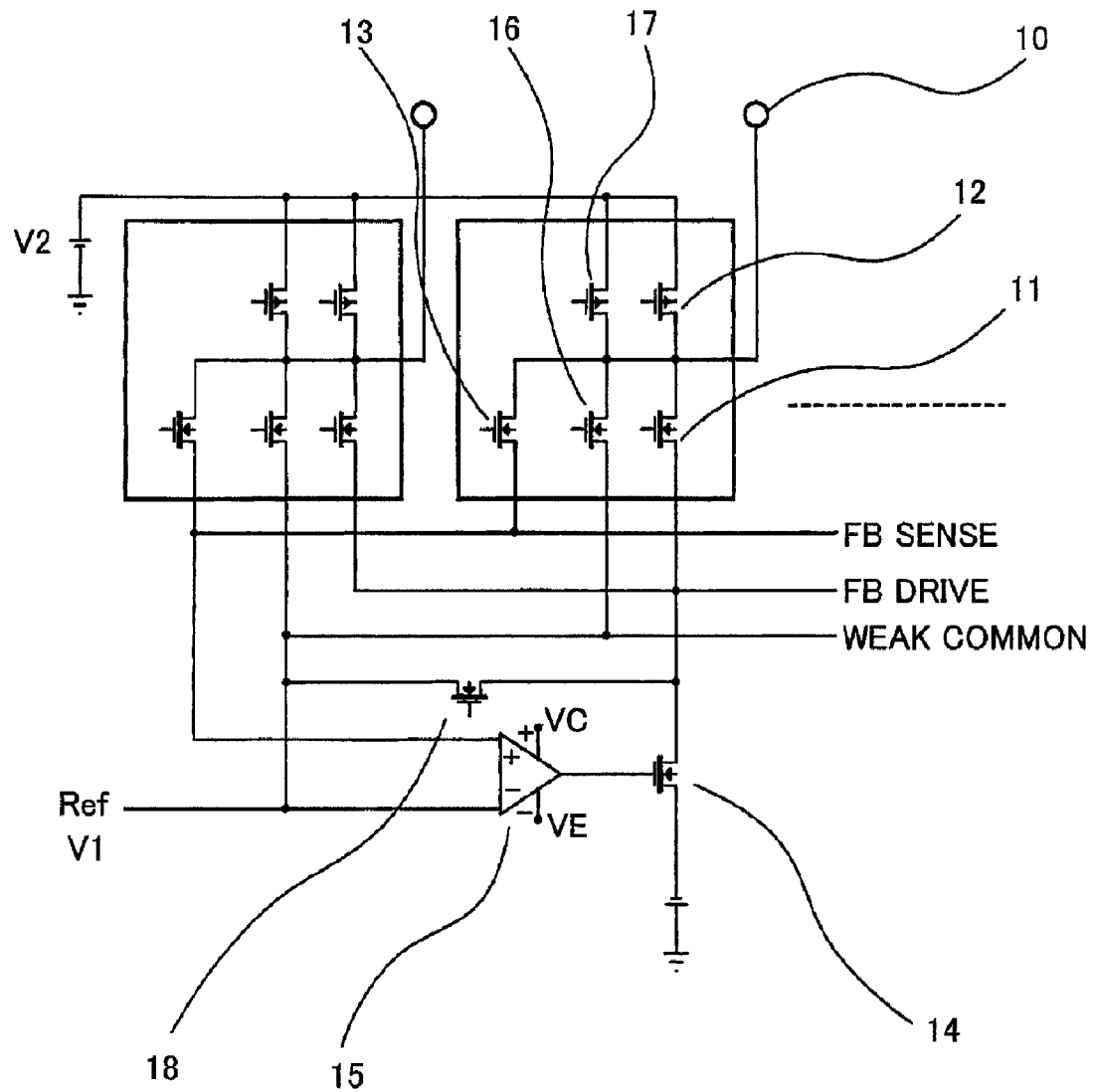
FIG. 1 is a diagram illustrating a circuit configuration of a scan driving unit according to the first embodiment.

In this embodiment, realized are the circuit configuration and driving method which does not impose strict requirements for such an AMP circuit. The constitution of the scan driving unit is concretely described with reference to FIGS. 1 and 4. For simple illustrating, FIG. 1 illustrates only a constitution of output circuits for two channels, but the output circuits are provided so as to correspond to the number of channels (the number of scanning wirings). A feedback amplifier is commonly-provided for the plurality of channels.

In FIG. 1, the IC driving output 10 is an output pad which is connected to the scanning wiring 2. The two switches including the strong drive performance P-ch MOSFET 12 and the weak drive performance P-ch MOSFET (P-ch MOSFET of a low drive performance) 17 are connected as driving means for the non-selection potential V2 to the scanning wirings in parallel. The strong drive performance P-ch MOSFET 12 drives the scanning wiring 2 to the non-selection potential V2. The weak drive performance P-ch MOSFET 17 is a switch whose drive performance is lower than the that of the strong drive performance P-ch MOSFET 12 (for example, ON-state resistance is ten times higher), and is used for transition of the potential of the scanning wiring from the selection potential to the non-selection potential.

Two switches including the strong drive performance N-ch MOSFET 11 and a weak drive performance N-ch MOSFET (N-ch MOSFET of a low drive performance) 16 are connected as the driving means for the selection potential V1 to the scanning wiring in parallel. The OPAMP 15 to which the potential of the scanning wiring is fed back is provided, and an output of the OPAMP 15 is connected to a source of the strong drive performance N-ch MOSFET 11. The weak drive performance N-ch MOSFET 16 (first switch) is a switch whose ability for drive is lower than that of the strong drive performance N-ch MOSFET 11 (for example, on-state resistance is 10 times higher), and is used for transition of the potential of the scanning wiring from the non-selection potential to the selection potential (first potential). The drive performance of the weak drive performance N-ch MOSFET 16 is lower than that of the OPAMP 15. The OPAMP 15 is a feedback amplifier which maintains the potential of the scanning wiring at the selection potential. The strong drive performance N-ch MOSFET 11 (second switch) is a switch which selects whether or not to supply the output from the OPAMP 15 to the scanning wiring.

The N-ch MOSFET 13 for feedback is a switch which connects the potential of the selected scanning wiring (driven by the selection potential) to an input of the OPAMP 15. A feedback off switch 18 is a switch which fixes the output of the OPAMP 15 at the reference potential when the potential of the scanning wiring is transited from the selection potential to the non-selection potential or from the non-selection potential to the selection potential. A signal whose waveform is same as that of a shift clock 200 (see FIG. 4) and whose level is shifted is input into the gate of the feedback off switch 18. As to its DC potential, Lo is a drain voltage of the AMP_N-ch MOSFET 14, and Hi is its drain voltage (5 V. The feedback off switch 18 is turned on during a potential transition period of the scanning wiring, namely, no scanning wiring is at the selection potential.

A driving method of the scanning wirings is concretely described below with reference to FIG. 4.

The shift register unit 7 outputs an N-line selection WEAK_SW signal 201 based on a shift clock 200 and shift data 200A. The N-line selection WEAK_SW signal 201 is level-shifted by a level shifter (not shown) to a voltage level at which the gate of the weak drive performance N-ch MOSFET 16 can be driven. The weak drive performance N-ch MOSFET 16 is turned on during a period where the N-line selection WEAK_SW signal 201 is Hi. As a result, the N-line driving waveform 207 (waveform of a signal to be output to the N-line scanning wiring) stably transits from the non-selection potential (for example, +10 V) to the selection potential (for example, −10V). The ON-state resistance of the weak drive performance N-ch MOSFET 16 is set to several dozen Ω to several dozens kΩ so that waveform disturbance (overshoot, undershoot, ringing and the like) does not occur at the time of the potential transition. The potential of the scanning wiring is controlled to the selection potential.

The shift register unit 7 outputs an N-line FB_SW/N-line selection AMP_SW signal 202. This signal is shifted by a level shifter in the buffered switch 8 to a voltage level at which the gate of the strong drive performance N-ch MOSFET 11 and the gate of the N-ch MOSFET 13 for feedback can be driven. As a result, the strong drive performance N-ch MOSFET 11 and the N-ch MOSFET 13 for feedback are simultaneously turned on. In addition, the N-line FB_SW/N-line selection AMP_SW signal 202 is inverted, and its level is shifted in order to turn off the feedback off switch 18. As a result, the potential of the selected scanning wiring is controlled to the reference potential (selection potential (for example, −10 V)).

Such feedback control corrects an influence of the voltage drop due to a current change of the scanning wirings 2 and the ON-state resistance of the strong drive performance N-ch MOSFET 11, so that the potentials of the scanning wirings can be maintained constant.

Thereafter, when the N-line FB_SW/N-line selection AMP_SW signal 202 is Lo, the N-line IC driving output 10 is disconnected from the feedback circuit. At the same time, an N+1-line selection WEAK_SW signal 204 is level-shifted. The weak drive performance N-ch MOSFET 16 for line N+1 is turned on and the weak drive performance P-ch MOSFET 17 for line N is turned on during a period where the N+1-line selection WEAK_SW signal 204 is Hi. The ON-state resistance of the weak drive performance P-ch MOSFET 17 is set to several dozen Ω to several dozen kΩ so that waveform disturbance does not occur at the time of the potential transition. As a result, an N-line driving waveform 207 stably transits from the selection potential to the non-selection potential. Thereafter, the strong drive performance P-ch MOSFET 12 fixes the N-Line IC driving output to the non-selection potential.

According to the circuit configuration in this embodiment, the potential (selection potential) of the driving signal on the scanning wiring is maintained at an appropriate value by the feedback control of the OPAMP 15. Since the switch of a low drive performance is used at the time of potential transition, an abrupt change in potential can be suppressed, so that the waveform disturbance such as overshoot, undershoot or ringing can be prevented. Since timing at which the OPAMP 15 operates is after the transition to the selection potential by means of the weak drive performance N-ch MOSFET 16, the output potential of the OPAMP 15 hardly deviates from around −10 V which is the reference potential (selection potential). For this reason, requirements of the slew rate and the AMP band may be ensured within a small voltage range of around −10 V. The switches exclusively used for the voltage transition are provided, so that performance demand for the OPAMP 15 is relaxed. Therefore, the highly reliable drive circuit with a feedback amplifier can be manufactured inexpensively.

Second Embodiment

In the first embodiment, the switching from the switch driving into the AMP driving is controlled by the control signal transmitted from the shift register unit 7. Normally, a logic circuit such as the shift register is operated by a low voltage (for example, 3.3 V). For this reason, in order to drive the switch which outputs the driving voltage of about ten to several dozen volts, the voltage level of the control signal should be shifted by the level shifter.

On the contrary, in the second embodiment, the switching from the switch driving into the AMP driving is realized by a self switch (control circuit) in the buffered switch 8. As a result, the circuit configuration is simplified and the accurate switching timing from a switch into AMP is realized. Since the other parts of the constitution are similar to those of the first embodiment, the characteristic constitution of the second embodiment is mainly described below.

(Scan Driving Unit)

Figure 5:
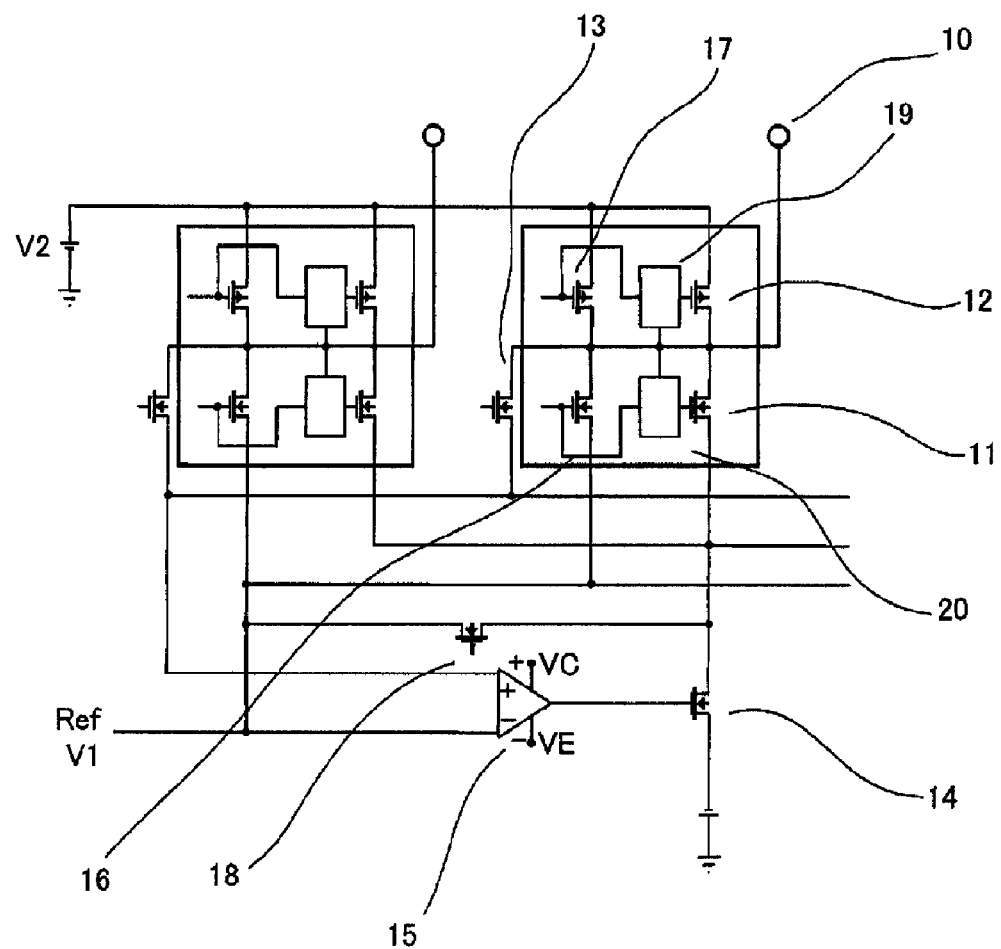
FIG. 5 is a diagram illustrating a circuit configuration of the scan driving unit according to the second embodiment.

FIG. 5 is a block diagram illustrating the scan driving unit according to the second embodiment. As shown in FIG. 5, a self switch 19 for P-ch is connected to the gate of the strong drive performance P-ch MOSFET 12. The self switch 19 for P-ch is a circuit which outputs a control signal for controlling the strong drive performance P-ch MOSFET 12 according to an output from the weak drive performance P-ch MOSFET 17. A self switch 20 for N-ch is connected to the gate of the strong drive performance N-ch MOSFET 11. The self switch 20 for N-ch is a circuit which outputs a control signal for controlling the strong drive performance N-ch MOSFET 11 (second switch) according to an output from the weak drive performance N-ch MOSFET 16 (first switch).

(Self Switch)

Figure 6:
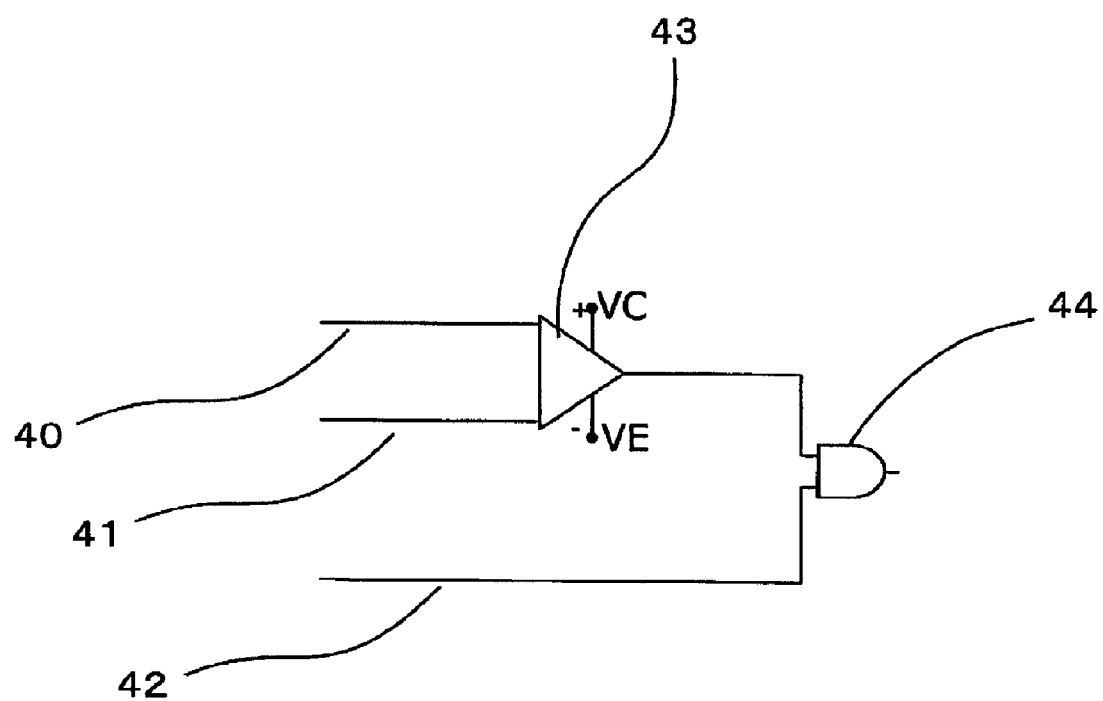
FIG. 6 is a diagram illustrating a circuit configuration of a self switch.

FIG. 6 illustrates a circuit configuration of the self switch. The self switch includes a voltage comparator 43 composed of an operational amplifier, and an AND gate circuit 44. The self switch 19 for P-ch and the self switch 20 for N-ch have the same basic constitution.

One input 40 of the voltage comparator 43 is connected to the scanning wirings (the outputs of the weak performance MOSFETs 16 and 17), and the other input 41 of the voltage comparator 43 is connected to a standard potential. In the self switch 19 for P-ch, the reference potential is set to a potential lower than the non-selection potential V2 (for example, V2−1 volts). In the self switch 20 for N-ch, the reference potential is set to a potential higher than the selection potential V1 (for example, V1+1 volts).

VC and VE are power source terminals of the voltage comparator 43. Since the voltage comparator 43 treats an input/output voltage equivalent to the selection potential V1 or the non-selection potential V2, a power supply voltage according to the input/output voltage is necessary. In this embodiment, VC is connected to GND, and VE is connected to a power source of the selection potential V1 minus several V (for example, V1−5 volts). A power supply voltage (for example, 5 volts or more volts to several dozens volts) higher than the power supply voltage (for example, not more than 3.3 volts) to be supplied to the shift register unit 7 is supplied to the self switches.

One input of the AND gate circuit 44 is connected to an output of the voltage comparator 43 and the other input of the AND gate circuit 44 is connected to a gate of the WEAK_ MOSFET (output of the level shifter). An output of the AND gate circuit 44 is connected to a gate of a STRONG_MOSFET.

(Operation of the P-ch Self Switch)

An operation of the self switch 19 for P-ch will be concretely described.

The weak drive performance P-ch MOSFET 17 is turned on, and the potential of the output 10 rises toward the non-selection potential V2. The voltage comparator 43 of the self switch 19 for P-ch compares the potential of the output 10 with the reference potential (for example, V2−1 volts). When the potential of the output 10 exceeds the reference potential, the voltage comparator 43 outputs an ON signal. The AND gate circuit 44 obtains AND of the output from the voltage comparator 43 and a signal obtained by inverting a gate control signal of the weak drive performance P-ch MOSFET 17. That is to say, when the weak drive performance P-ch MOSFET 17 is in ON state and the potential of the output 10 rises to nearly the non-selection potential V2 (target value), a gate control signal is output from the AND gate circuit 44 into the strong drive performance P-ch MOSFET 12. As a result, the strong drive performance P-ch MOSFET 12 is turned on. The ON state of the strong drive performance P-ch MOSFET 12 is maintained by a latch circuit, not shown, until the weak drive performance N-ch MOSFET 16 is turned on.

(Operation of the N-Ch Self Switch)

An operation of the self switch 20 for N-ch will be concretely described.

The weak drive performance N-ch MOSFET 16 is turned on and the potential of the output 10 drops toward the selection potential V1. The voltage comparator 43 of the self switch 20 for N-ch compares the potential of the output 10 with the reference potential (for example, V1+1 volts). When the potential of the output 10 is lower than the reference potential, the voltage comparator 43 outputs an ON signal. The AND gate circuit 44 obtains AND of the output from the voltage comparator 43 and a voltage of a gate control signal from the weak drive performance N-ch MOSFET 16. That is to say, when the weak drive performance N-ch MOSFET 16 is in ON state and the potential of the output 10 drops to nearly the selection potential V1 (target value), the gate control signal is output from the AND gate circuit 44 to the strong drive performance N-ch MOSFET 11. As a result, the strong drive performance N-ch MOSFET 11 is turned on. The ON state of the strong drive performance N-ch MOSFET 11 is maintained by the latch circuit, not shown, until the weak drive performance P-ch MOSFET 17 is turned on.

In the constitution using the level shifter in the first embodiment, since the driving of the MOSFETs is controlled at the timing of the level shifters, the high-speed and accurate level shifters are necessary. On the contrary, in the constitution of the second embodiment, the self switch automatically starts the driving of the strong performance MOSFET according to the output potential (namely, when the output potential reaches the target value). Therefore, the respective MOSFETs can be driven at appropriate and accurate timings. Since requirements of the accuracy are reduced, the circuit can be simplified. Further, since the number of the level shifters can be greatly reduced, a chip area of the driving IC can be reduced.

Third Embodiment

Figure 9A:
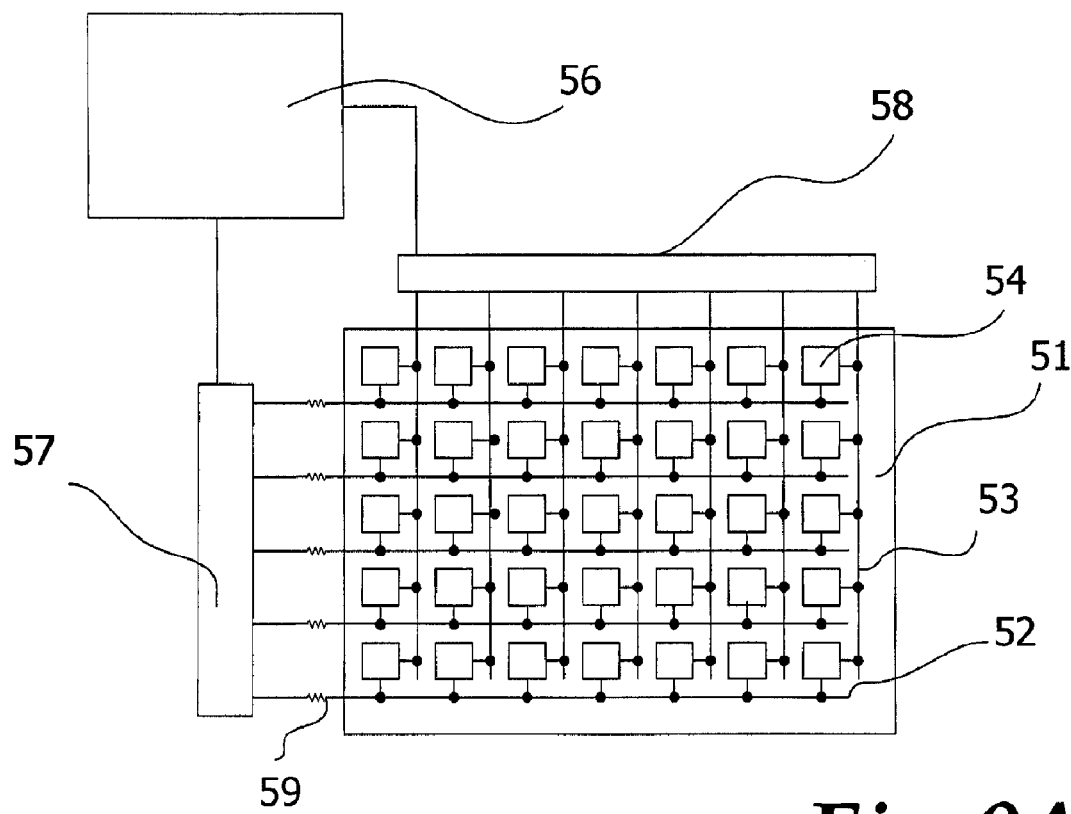
FIG. 9A is a plan view illustrating a constitution which drives a liquid crystal backlight.
Figure 9B:
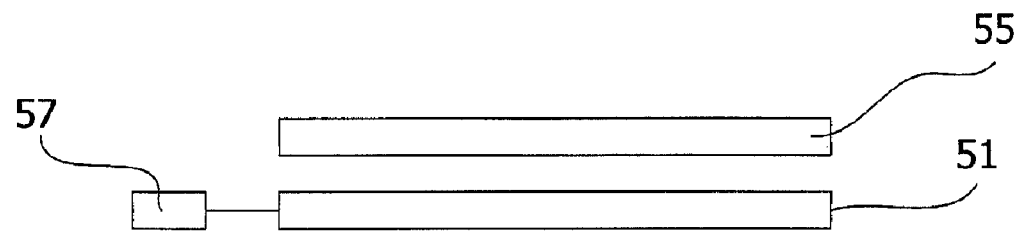
FIG. 9B is a cross-sectional view thereof

In the first and second embodiments, the scan driving unit 5 drives the matrix panel of the image display apparatus, but in a third embodiment, the scan driving unit 5 drives an LED backlight of a liquid crystal display apparatus. As a result, while luminance irregularity of the backlight is being suppressed, sequential driving of lines at a low price is enabled. FIGS. 9A and 9B are diagrams illustrating a constitution for driving the LED backlight of the liquid crystal display apparatus, FIG. 9A is a plan view, and FIG. 9B is a cross-sectional view.

The LED backlight of the liquid crystal display apparatus has an LED matrix 51, a control unit 56, a line driving unit 57 and a column driving unit 58. The line driving unit 57 and the column driving unit 58 are respectively composed of an IC (integrated circuit).

The LED matrix 51, in which a plurality of LED blocks 54 (LEDs are connected in series) is arranged, emits light toward a liquid crystal panel 55 from the back of it so that a desired image is displayed.

The LED blocks 54 on the LED matrix 51 are matrix-driven by line selection wirings 52 and column selection wirings 53. The line selection wirings 52 are respectively connected to output terminals of the line driving unit 57 via resistances 59. The column selection wirings 53 are respectively connected to output terminals of the column driving unit 58.

The control unit 56 controls the line driving unit 57 and the column driving unit 58, and applies a driving voltage of several dozen volts, for example, between the line selection wirings 52 and the column selection wirings 53 via the resistances 59. As a result, the LED blocks 54 emit light. The LED blocks emit light according to a video on the liquid crystal panel 55, so that bright portions of the screen emit light brightly, and dark portions of the screen emit light slightly. As a result, luminance control (local dimming) according to the video is enabled.

In this embodiment, the control unit 56 controls the timing of the switching the column selection wirings 53, the selection time, and the timing at which a voltage is applied to the line selection wirings 52. As a result, the luminance control is made in synchronization with the video.

The brightness obtained by the light emission of the LED blocks 54 is determined by applied voltages to the LED blocks 54 (applied currents to the LED blocks 54 controlled by the resistances 59). Therefore, in order to obtain the accurate luminance characteristics without dispersion, the stabilization of the driving voltage (driving current) of the LED blocks 54, namely, prevention of the waveform disturbance of the driving voltage (overshoot, undershoot, ringing and the like) becomes important.

(Driving Unit)

The line driving unit 57 is a drive circuit which selects one or a plurality of line selecting wirings 52. The line driving unit 57 applies a selection potential of minus several dozen V to the line selection wirings 52 to be selected, and applies a GND potential to the other line selection wirings 52. The line selection wirings 52 to be selected are sequentially switched, so that the selection of the LED blocks 54 in a vertical direction is realized. The line driving unit 57 is composed of an integrated circuit.

The column driving unit 58 is a drive circuit which selects the column selection wirings 53 based on an input image signal, controls selection time and controls an amount of light emission from the respective LED blocks 54.

In the above constitution, the line driving unit 57 and the column driving unit 58 are realized by using the circuit configurations of the scan driving unit 5 and the modulation driving unit 6 in the first and second embodiments. As a result, overshoot, undershoot and ringing can be repressed. Thus, since the voltage (electric current) and the time for applying to the LED blocks 54 can be accurately controlled, the accurate luminance control is achieved, and the high-definition video display is achieved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-026346 filed on Feb. 6, 2008 and Japanese Patent Application No. 2009-000850 filed on Jan. 6, 2009, which are hereby incorporated by reference herein in their entirety.

What is claimed is:

1. A drive circuit of a display panel having wirings and display devices connected to the wirings, comprising:
    a first switch that transits potential of the wirings toward a first potential;
    a feedback amplifier that maintains the potentials of the wirings at the first potential;
    a second switch that selects whether or not to supply an output from the feedback amplifier to the wirings; and
    a self switch that controls the second switch by comparing the potential of the wirings with a reference potential that is higher by a predetermined value than the first potential,
    wherein the first switch and the second switch are connected to the wirings in parallel,
    and wherein a drive performance of the first switch is lower than that of the second switch.

2. A drive circuit of a display panel according to claim 1, wherein
    the display devices are display devices which are matrix-driven, and
    the wirings are scanning wirings for matrix driving.

3. A display apparatus, comprising:
    the drive circuit according to claim 1; and
    a display panel that is driven by the drive circuit.

* * * * *